US009488706B2

(12) United States Patent
Vester

(10) Patent No.: US 9,488,706 B2
(45) Date of Patent: Nov. 8, 2016

(54) TRANSMITTING DEVICE FOR DRIVING A HIGH-FREQUENCY ANTENNA OF A MAGNETIC-RESONANCE DEVICE

(75) Inventor: Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 950 days.

(21) Appl. No.: 13/440,552

(22) Filed: Apr. 5, 2012

(65) Prior Publication Data

US 2012/0268129 A1 Oct. 25, 2012

(30) Foreign Application Priority Data

Apr. 6, 2011 (DE) .................. 10 2011 006 872

(51) Int. Cl.
*H03F 3/24* (2006.01)
*G01R 33/36* (2006.01)

(52) U.S. Cl.
CPC ....... *G01R 33/3607* (2013.01); *G01R 33/3614* (2013.01); *H03F 3/24* (2013.01); *H03F 2200/324* (2013.01); *H03F 2200/351* (2013.01)

(58) Field of Classification Search
USPC .......... 324/300–322; 600/407–435; 340/146
See application file for complete search history.

(56) References Cited

U.S. PATENT DOCUMENTS

| 3,968,424 | A | * | 7/1976 | Ernst | ...................... | G01R 33/46 324/310 |
| 5,612,647 | A | * | 3/1997 | Malec | ................... | H03F 3/2178 330/146 |
| 6,639,462 | B1 | | 10/2003 | Luu | ................................. | 330/51 |
| 6,930,483 | B2 | * | 8/2005 | Sabate | ............... | G01R 33/3614 324/309 |
| 6,989,673 | B2 | * | 1/2006 | Zhu | ............................... | 324/318 |
| 7,053,618 | B2 | * | 5/2006 | Zhu | ............................... | 324/318 |
| 7,075,301 | B2 | * | 7/2006 | Zhu | ............................... | 324/318 |
| 7,075,302 | B2 | * | 7/2006 | Zhu | ............................... | 324/318 |
| 7,346,498 | B2 | * | 3/2008 | Grigoryan | ..................... | 704/203 |
| 7,358,737 | B2 | * | 4/2008 | Hoult | ........................... | 324/322 |

(Continued)

FOREIGN PATENT DOCUMENTS

CN         101836358 A         9/2010

OTHER PUBLICATIONS

German Office Action dated Apr. 25, 2012 for corresponding German Patent Application No. DE 10 2011 006 872.4 with English translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

A transmitting device for driving a high-frequency antenna of a magnetic-resonance device using a target signal capable of being amplitude-modulated is provided. A number N of similarly embodied amplifier modules, where N is at least two, a signal-conditioning device, and a combining device for combining output signals of the amplifier modules into the target signal are provided. The signal-conditioning device generates N drive signals having a predetermined pulse frequency that consist of pulses having a length dependent on a desired target amplitude and having a phase corresponding to the desired target phase and a frequency corresponding to the desired target frequency. The pulses of the individual drive signals are mutually offset in time by, in each case, 1/N of a pulse period corresponding to the pulse frequency. Each drive signal is fed to an amplifier module.

20 Claims, 7 Drawing Sheets

(56) References Cited

U.S. PATENT DOCUMENTS

| | | | |
|---|---|---|---|
| 7,411,450 | B2 | 8/2008 | Albrecht |
| 7,633,293 | B2* | 12/2009 | Olson et al. .................. 324/318 |
| 8,324,900 | B2* | 12/2012 | Helvoort et al. ............. 324/322 |
| 8,502,539 | B2* | 8/2013 | Lai ..................... G01R 33/3852 324/309 |
| 8,604,791 | B2* | 12/2013 | Vaughan et al. ............. 324/318 |
| 8,760,164 | B2* | 6/2014 | Rivas Davila et al. ...... 324/322 |
| 8,929,563 | B2* | 1/2015 | Kinoshita ............... H02J 17/00 381/323 |
| 2004/0158459 | A1* | 8/2004 | Grigoryan .................... 704/203 |
| 2005/0024056 | A1* | 2/2005 | Sabate ............... G01R 33/3614 324/322 |
| 2005/0110487 | A1* | 5/2005 | Zhu .............................. 324/309 |
| 2005/0110488 | A1* | 5/2005 | Zhu .............................. 324/309 |
| 2005/0134267 | A1* | 6/2005 | Zhu .............................. 324/309 |
| 2005/0134268 | A1* | 6/2005 | Zhu .............................. 324/309 |
| 2007/0222449 | A1* | 9/2007 | Hoult ........................... 324/318 |
| 2008/0088305 | A1* | 4/2008 | Olson et al. .................. 324/309 |
| 2008/0122532 | A1 | 5/2008 | Kroeckel |
| 2010/0164498 | A1* | 7/2010 | Helvoort et al. ............. 324/322 |
| 2011/0187369 | A1* | 8/2011 | Rivas Davila et al. ...... 324/318 |
| 2012/0062230 | A1* | 3/2012 | Vaughan et al. ............. 324/318 |
| 2012/0163619 | A1* | 6/2012 | Kinoshita ............... H02J 17/00 381/77 |
| 2012/0223709 | A1* | 9/2012 | Schillak et al. .............. 324/309 |
| 2012/0249145 | A1* | 10/2012 | Lai ..................... G01R 33/3852 324/318 |
| 2012/0268129 | A1* | 10/2012 | Vester ........................... 324/314 |
| 2014/0097846 | A1* | 4/2014 | Lemaire et al. .............. 324/322 |

OTHER PUBLICATIONS

F. Raab, et al., "RF and Microwave Power Amplifier and Transmitter Technologies—Part 1," High Frequency Electronics, pp. 1-9, 2003.
F. Raab, et al., "RF and Microwave Power Amplifier and Transmitter Technologies—Part 2," High Frequency Electronics, pp. 1-9, 2003.
F. Raab, et al., "RF and Microwave Power Amplifier and Transmitter Technologies—Part 3," High Frequency Electronics, pp. 1-9, 2003.
F. Raab, et al., "RF and Microwave Power Amplifier and Transmitter Technologies—Part 4," High Frequency Electronics, pp. 1-7, 2003.
F. Raab, et al., "RF and Microwave Power Amplifier and Transmitter Technologies—Part 5," High Frequency Electronics, pp. 1-6, 2004.
Prof. Dr.-Ing. habil. Albrecht Moschwitzer, "NETZ Formeln der Elektrotechnik und Elektronik," 1986.
Chinese Office action for related Chinese Application No. 2012100997374, dated Aug. 5, 2015, with English Translation.
Korean Office action for related Korean Application No. 10-2012-0036251, dated Jul. 14, 2015.

* cited by examiner

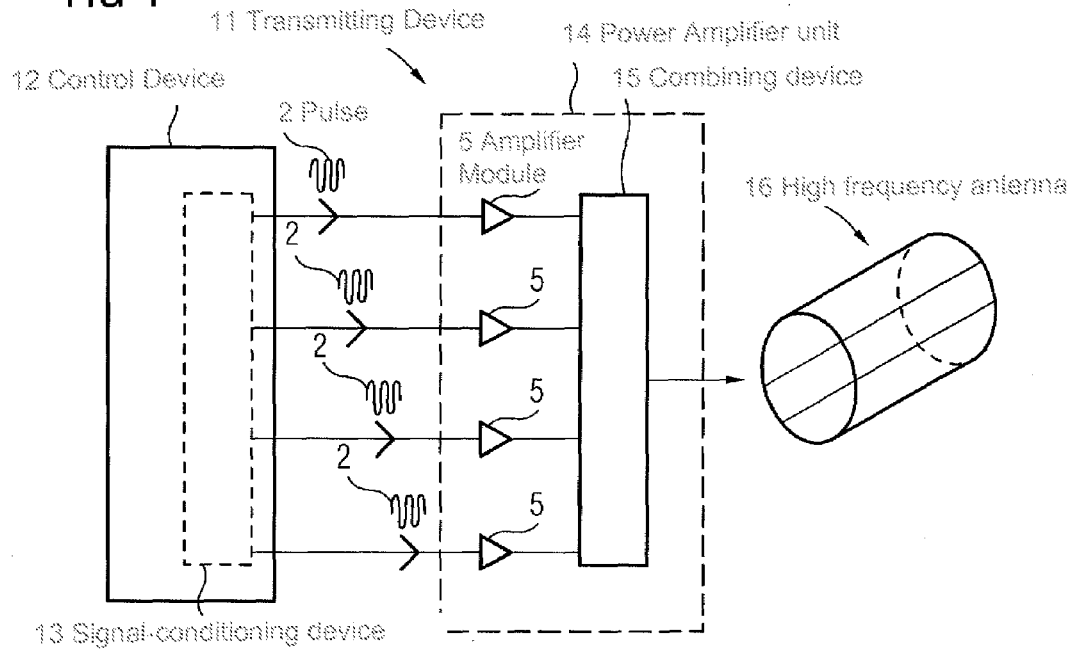
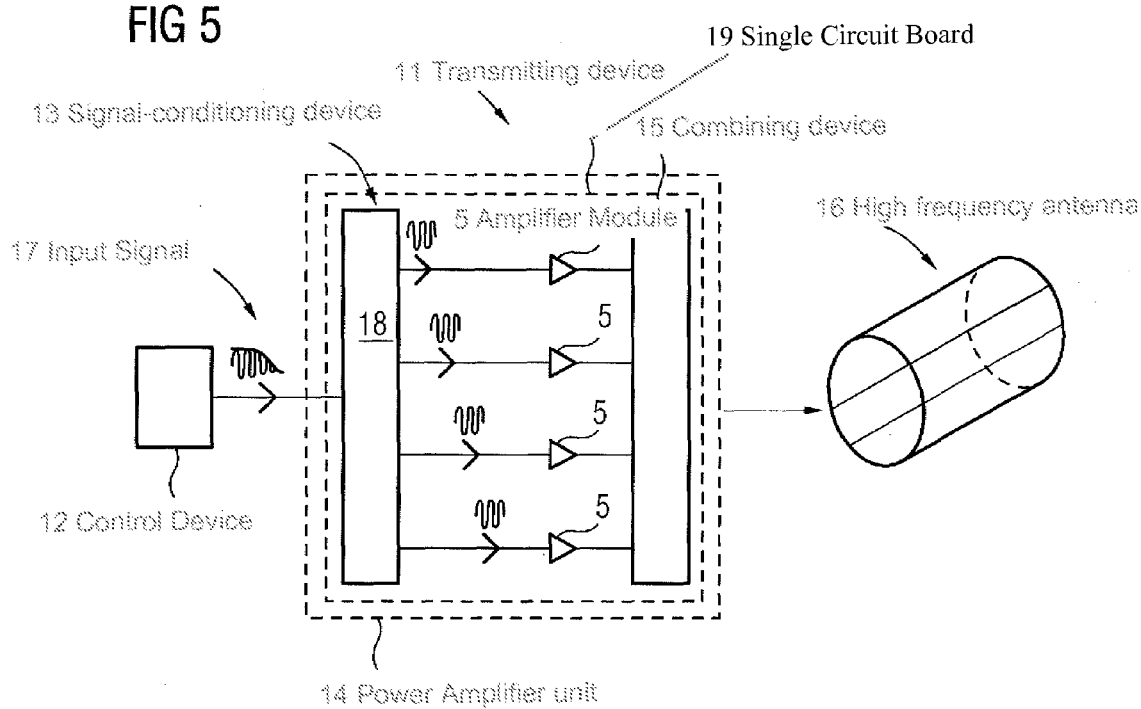

TRANSMITTING DEVICE FOR DRIVING A HIGH-FREQUENCY ANTENNA OF A MAGNETIC-RESONANCE DEVICE

This application claims the benefit of DE 10 2011 006 872.4, filed on Apr. 6, 2011.

BACKGROUND

The present embodiments relate to a transmitting device for driving a high-frequency antenna of a magnetic-resonance device using an amplitude-modulated target signal.

Known magnetic-resonance devices are employed for clinical applications. As part of the imaging process, nuclear spins of an object being examined that have been aligned by the magnetic-resonance device via a high-frequency antenna are excited, and image data is registered using a receiving antenna. For operating the transmitting antenna, a high-frequency signal (e.g., a target signal) that is capable of being amplitude-modulated and has a high power is used. The high powers may be supplied by a power-amplifier unit incorporated in a transmitting unit of the magnetic-resonance device.

The amplitude modulation of the high-power transmission signal is problematic. The target signals employed for exciting are generated by linearly operating transistor power amplifiers. The theoretically possible efficiency of the Class-B amplifiers customarily employed is at most approximately 78%. However, this efficiency drops sharply when the possible output voltage (amplitude) is exploited partially. The result is that small output voltages will give rise to substantial power dissipation that drives up the cost of the power semiconductors and of cooling the power semiconductors. Owing to the given technical limits in the amplifier, the mean amplifier power that is possible may not always be exploitable in view of the specific absorption rate (SAR) in the patient.

Another problem is that the power-amplifier unit is matched to a specific load impedance of the high-frequency antenna. The impedance experienced by the respective amplifier module may vary owing to changes in the load due to the object being examined (e.g., a patient) or owing to couplings between a plurality of high-frequency antennas. There is a drop in efficiency in the case of a low-ohmic load (large current, small voltage), and the output power that may be drawn has to be reduced.

Because the basic problem described occurs not only in the magnetic resonance but whenever amplitude-modulated high-frequency signals are to be generated (e.g., in broadcasting or mobile radio applications), there are already a number of approaches to a solution that are described in, for example, a series of articles by Frederick H. Raab et al. that have been published in succeeding editions of "High Frequency Electronics," starting with part 1 in the issue dated May 2003, pp. 22-36. However, all the approaches described there have various disadvantages.

Thus it was proposed to use a Doherty modulation or Chireix modulation. Only a moderate efficiency gain may be achieved thereby in a limited amplitude range. It was further proposed to modulate the target amplitude using a variable operating voltage (e.g., Kahn concept or EER concept). An external fast modulator is disadvantageously required for that. A switching amplifier with direct delta-sigma modulation may also be used, although high-level switching losses occur owing to frequent edges, and extremely broadband end-level controlling is necessary. Output filtering is also required.

In the fifth part of the series of articles ("High Frequency Electronics," January 2004, pp. 46-54), subjecting the carrier signal to pulse-width modulating was proposed. The width of each "burst" is proportional to the wanted envelope of the output amplitude. A bandpass filter is used for generating the amplitude-modulated target signal from the output signal of the amplifier. However, disruptions and efficiency losses disadvantageously occur owing to powers in sidebands. A narrowband output filter is used, which is expensive and space consuming.

SUMMARY AND DESCRIPTION

The present embodiments may obviate one or more of the drawbacks or limitations in the related art. For example, a transmitting device of a magnetic-resonance device configured such that a high efficiency level of amplifier modules may be utilized without additional filters, is provided.

For a transmitting device, a number N of similarly embodied amplifier modules, where N is at least 2, a signal-conditioning device, and a combining device for combining output signals of the amplifier modules into a target signal are provided. The signal-conditioning device generates N drive signals having a predetermined pulse frequency that consist of pulses having a length that is dependent on the desired target amplitude and having a phase corresponding to a desired target phase and a frequency corresponding to a desired target frequency. Pulses of the individual drive signals are mutually offset in time by, in each case, 1/N of a pulse period corresponding to the pulse frequency. Each drive signal is fed to an amplifier module.

A certain number, N, of individual, similar amplifier modules that operate in parallel and are driven by pulses that are mutually offset in time are provided. The pulses are generated at fixed time intervals, so a new pulse, in each case, is provided after the pulse period that corresponds to the pulse frequency. The instants, at which a new pulse begins is different for all amplifier modules. The pulses are amplified by the amplifier modules and recombined appropriately. The pulses already have the desired target phase and the desired target frequency so that no further matching is necessary. The length of the pulses is dependent on the target amplitude of the target signal. The length of pulses that are mutually offset in time and contained in drive signals is varied for realizing the amplitude modulation of the target signal.

Each of the amplifier modules is switched on or off through pulse-length modulation. Each pulse is a packet of periods having the high frequency to be generated, the target frequency, and the desired target phase. The pulse frequency of the modulation is limited only by the moderate bandwidth of the high-frequency control and may be, for example, 0.5 to 10 MHz (e.g., 1 MHz). The length of the pulses is determined by a duty factor as a function of the desired target amplitude. If a phase of a desired constant target amplitude is considered, the pulse trains of all drive signals may have the same duty factor but are mutually offset in time by an N-th of the pulse period (e.g., a switching period). The pulses are mutually superimposed such that an amplitude ripple of the target signal (e.g., disruptive peaks outside the wanted target frequency) appears at N times the pulse frequency (e.g., at 4 MHz in the case of four amplifier modules and a pulse frequency of 1 MHz). In the magnetic-resonance application of the present embodiments, the sidebands may be pushed out from the bandwidth (e.g., +/−0.5 MHz) that may be generated by the basic field gradients so that the sidebands do not encounter excitable nuclear spins.

In the magnetic-resonance application, bandpass filtering between the transmitting-device output and the high-frequency antenna may be dispensed with. Thus, the amplitude ripples due to the departures from the ideal target-amplitude curve lie outside the relevant range. The amplitude ripples are unable to excite any nuclear spins and so will not disrupt a magnetic-resonance measurement.

A desired target-amplitude curve may be gradually approximated by the plurality of amplifier modules employed and the drive signals that are offset in time. This will be explained in more detail for an embodiment in which there are four amplifier modules (N=4). If the duty factor for the pulses is in the 0-to-25% range, for example, then only one stage is simultaneously active at any time, and the target signal changes back and forth between 0 and 25% of the maximum high frequency-voltage. The contributions of a plurality of amplifier modules begin to overlap when the duty factor is higher. Thus, between a 25% and 50% duty factor, either one or two amplifier modules will be turned on simultaneously. With a 95% duty factor, for example, the summation voltage is 75% for one fifth of the time and 100% for four fifths of the time, giving a mean of 95%.

A finer grading is achieved in approximating the target amplitude (e.g., the output voltage). Thus, when N=4, there will be five voltage levels. Thus, the target amplitude error is reduced by a factor N compared with single-level pulse-width modulating, as has been described with reference to the prior art. The power dissipated in the sidebands that are formed (e.g., amplitude ripples) decreases quadradratically with the voltage interval (e.g., by a factor $1/(N+1)^2$, so 0.04 when N=4). This is an advantage because the sideband power reaches the patient and contributes to the SAR when bandpass filtering is dispensed with. The extra contribution is therefore reduced to an insubstantial amount given a sufficient number of levels (e.g., four to eight levels).

Amplitude modulating is performed using trigger pulse-width modulation with a plurality of time-staggered levels. High-frequency power generating is achieved for variable output voltages (e.g., target amplitudes) and loads at a good efficiency level without the need for an additional modulator circuit for the operating voltage. The high switching rate for the individual pulses offset in time results in far off sidebands that are unable to excite any nuclear spins in the magnetic resonance. The power bandpass filter may thus be dispensed with at the output. The power of the sidebands continues making an insubstantial contribution to the SAR owing to the resulting multi-stage modulation.

For joining the output signals of the amplifier modules together, the output voltages are added to each other, or current flows are combined. There are several possibilities for doing this. The combining device may include a transformer for each amplifier module. In one embodiment, in high-frequency terms, the combining device may include, for each amplifier module, a quarter-wave line or 90° phase shifter. The outputs of the amplifier modules may be combined onto a common node via quarter-wave lines or 90° phase shifters.

The high-frequency current generated by the currently active amplifier modules may traverse the currently non-active amplifier modules with a low loss. No blocking must occur because of connections to currently non-active amplifier modules. The currently non-active amplifier modules also present a low output impedance (e.g., short-circuit). This low output impedance also applies to the embodiment using quarter-wave lines connected in parallel at the output side, since the short-circuit is transformed into an open circuit at the output, and no current may flow away into the unused branches from the summation node. The transmitting device may be embodied such that for a driving device for the amplifier modules, amplifier modules, to which currently no pulse is being applied, will present a low impedance. In one embodiment, if the amplifier modules have at least one transistor, the transistor may be able to be driven such that the transistor is always turned on when the transmitting device is operating. Thus, if the individual amplifier modules include one transistor (e.g., if the individual amplifier modules) are realized as MOSFET half-bridges, then the low impedance may be produced by leaving one of the transistors (e.g., for MOSFET half-bridges, one of the two transistors) in a statically turned-on state between the high-frequency pulses. If a transformer is connected upstream of the transistor, then an additional conductor connection, to which a switching voltage may be applied when no pulse is being applied to the amplifier module, is routed to the transistor. Thus, whenever no pulse is being applied to the amplifier module, an additional branch that carries an adequate switching voltage that leaves the transistor switched end-to-end is created.

Alternatively, each output of the amplifier modules may be short-circuited via a diode switch (e.g., a PIN diode switch). Thus, in parallel with each amplifier module, a PIN diode switch able to short-circuit the output when no pulse is being applied to the relevant amplifier module may also be connected.

The drive signals that are offset in time and contain the pulses, with a new pulse always beginning after the predetermined pulse period, may be generated in a number of ways. In one embodiment, the signal-conditioning device may already be part of a control device belonging to the magnetic-resonance device. The drive signals are already fed from outside into a power-amplifier unit containing the amplifier modules and the combining device. Already suitably matched drive signals are predetermined as input signals for the power-amplifier unit.

In another embodiment, a conventional input signal may be used. Although a conventional input signal of such kind already has the target frequency and the target phase, the input signal has already been amplitude-modulated in the way the target is later also to be amplitude-modulated. One embodiment of a circuit is provided for generating the suitable drive signals, offset in time, for the amplifier modules from an input signal of such kind. In one embodiment, when an input signal that is amplitude-modulated and already has the frequency and phase of the target signal is used, the signal-conditioning device may be realized as a signal-conditioning circuit (e.g., structurally integral with the amplifier modules and the combining device in a power-amplifier unit having in a first branch, an amplitude limiter for generating a base signal that has a constant amplitude and the frequency and phase of the target signal and having in a second branch, a demodulator for determining a direct-current signal indicating the amplitude modulation, the direct-current signal driving a switching device for generating the pulses of the drive signals pulses from the base signal). The input signal is thus divided into relevant components, with the base signal, which already has the target frequency and target phase, being used directly for generating the pulses. A switching device that enables the base signal for the pulse length at the corresponding amplifier module is used. The pulse length is derived from the direct-current signal describing the amplitude modulation. In one embodiment, the switching device may include N comparators, N switches, one sawtooth-signal generator, and one time-delay block. The sawtooth signal and the outputs of the time-delay block supplying N sawtooth signals that are in each case mutually offset in time by 1/N of the pulse period corresponding to the pulse frequency are compared in the comparators with the direct-current signal. As a function of the comparison result, a switch that is assigned to a comparator and an amplifier module is opened, and the base signal is forwarded to an amplifier module. The duty factor may thus be correctly set via a simple circuit.

The present embodiments also relate to a power-amplifier unit of a transmitting device that inside a housing, has the signal-conditioning device, the amplifier modules, and the combining device. For example, the signal-conditioning device, the amplifier modules, and the combining device may be realized on a common circuit board. The result is an advantageous compact assembly, in which an input signal that is already customary in the prior art, is amplitude-modulated, and has the target frequency and target phase is used. The input signal is converted into the corresponding drive signals via a signal-conditioning circuit so that the N similar amplifier modules may be driven, and the target signal may be tapped at the output of the power-amplifier unit. The above disclosure may be applied analogously to the power-amplifier unit.

In the case of the transmitting device of the present embodiments, the signal-conditioning device may be integrated in a control device of the magnetic-resonance device. The drive signals may thus already be supplied as input signals to a power-amplifier unit, which may then contain the amplifier modules and the combining device as a compact assembly. The output signal of the control device is matched so that an implementation as a signal-conditioning circuit is not necessary.

The present embodiments also relate to a method for generating an amplitude-modulated target signal for driving the high-frequency antenna of a magnetic-resonance device (e.g., employing one embodiment of a transmitting device). In the method, a number N, where N≥2, of drive signals having a predetermined pulse frequency that consist of pulses having a length that is dependent on the desired target amplitude and having a phase corresponding to the desired target phase and a frequency corresponding to the desired target frequency are generated. The pulses of the individual drive signals are mutually offset in time by, in each case, 1/N of the pulse period corresponding to the pulse frequency. The drive signals are, in each case, amplified by similar amplifier modules and combined into the target signal. The disclosure above regarding the transmitting device also applies analogously to the method of the present embodiments that may be realized using the transmitting device of the present embodiments. The drive signals are generated, for example, directly on a control device of the magnetic-resonance device in keeping with the required target amplitudes or target-amplitude curves and serve the amplifier modules as an input signal. An input signal that has the target frequency and target phase may be made available by a control device of the magnetic-resonance device as well as a modulated amplitude with a purpose to describe the modulation of the target amplitude. For example, two branches of a signal-conditioning circuit may be used. A base signal having a constant amplitude but the target frequency and the target phase may be provided by a limiter in one branch. The amplitude curve is extracted in the other branch by demodulation. For example, through a corresponding comparison with sawtooth signals from the base signal that have been offset in time, the pulses of the drive signal pulses may be "cut out." The frequency of the sawtooth signal corresponds to the pulse frequency.

BRIEF DESCRIPTION OF THE DRAWINGS

FIG. 4 shows one embodiment of a transmitting device;
FIG. 5 shows another embodiment of a transmitting device.

DETAILED DESCRIPTION OF THE DRAWINGS

Figure 1:
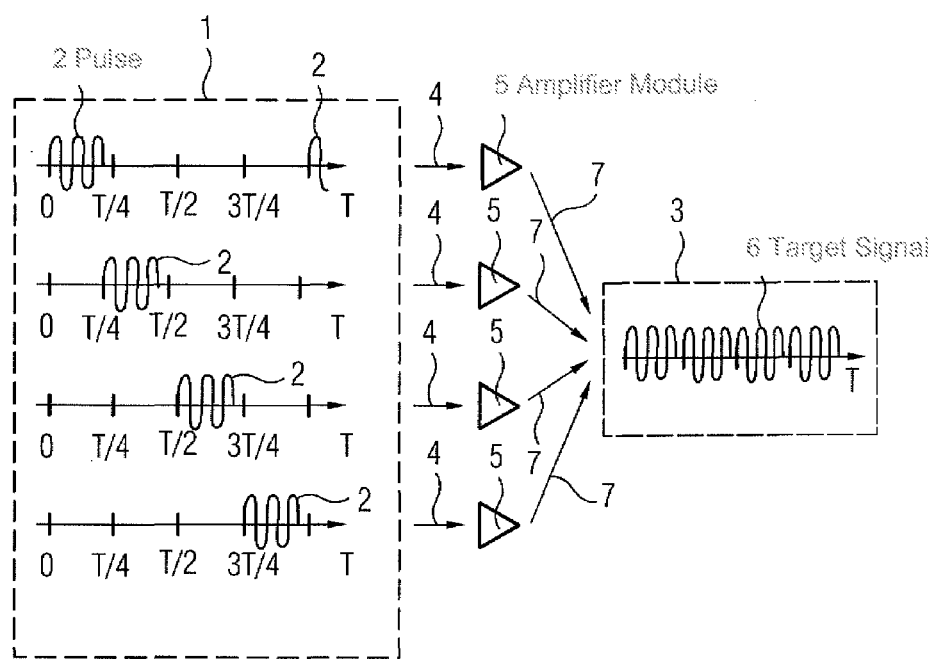
FIG. 1 shows an example of the basic principle of the present embodiments.

FIG. 1 illustrates the basic principle of the present embodiments. As in the following exemplary embodiments, four is assumed as the number of drive signals (thus N 4). Other numbers greater than 2 are also possible (e.g., N=5 to 8). At a first act in the exemplary embodiment shown, four drive signals are generated that are combined in box 1. Drive signals include pulses 2. The pulses 2 are wave packets having a frequency and phase that correspond to a target frequency and a target phase of a target signal, respectively, to be generated (see box 3). The target frequency is a magnetic resonance-frequency of a magnetic-resonance device, in which the method of the present embodiments is being applied, since a high-frequency antenna of the magnetic-resonance device is to be driven as a transmitting antenna. Pulses 2 follow on from one another in the drive signals such that a new pulse begins after a pulse period T. The maximum pulse length of the pulses 2 is pulse period T corresponding to a specific pulse frequency. The length of pulses 2 is thus determined by a sampling ratio that, as will be explained in more detail below, is like the pulse length, dependent on a desired (mean) target amplitude of the target signal.

As shown in FIG. 1, the pulses 2 are mutually offset in time in the case of the four different drive signals (e.g., each offset by one quarter of pulse period T, which may correspond to a pulse frequency of 1 MHz). In FIG. 1, the instant at which a pulse 2 begins is, in the case of a second drive signal, T/4 after the instant the pulse begins in the first drive signal; the instant at which a pulse 2 begins is, in the case of a third drive signal, T/2 (=2T/4) after the start of the pulse in the first drive signal; the instant at which a pulse 2 begins is, in the case of the fourth drive signal, 3T/4 after the start of the pulse in the first drive signal.

The drive signals are each fed to one of four similar amplifier modules 5 (see arrows 4), where the drive signals are amplified. The amplitude of the wave packets of the pulses 2 is amplified such that the final result is one quarter of the wanted maximum amplitude. In other words, each of amplifier modules 5 is able to supply one quarter of the maximum wanted output power (e.g., 1/N of the desired maximum overall output power in the case of N drive signals and amplifier stages).

The output signals resulting from the drive signals are combined following amplification by amplifier modules 5 into target signal 6 shown in box 3 (see arrows 7).

In all, therefore, each of the amplifier modules 5 (which may also be referred to as individual amplifier stages) is turned on or off through pulse-length modulation of the pulses 2, with each pulse 2 being a packet of periods having the target frequency to be generated and the desired target phase. If a period of constant desired target amplitude, appearing as the mean amplitude in target signal 6, is assumed, then although the pulse trains of all the drive signals will have the same duty factor, the pulse trains will be mutually offset, as shown, by one quarter of the switching period. Shown in FIG. 1 by way of example is the case, in which the duty factor is in the 0-to-25% range. Only one amplifier module 5 at a time is active simultaneously so that the target signal 6 as the summation signal changes back and forth between 0 and 25% of the maximum high-frequency voltage. Higher duty factors are also possible so that the contributions of a plurality of amplifier modules 5 will begin to overlap. Thus, between a 25% and 50% duty factor, either one or two of the amplifier modules 5 are activated simultaneously. At 50% to 75%, two or three levels are activated simultaneously, and above 75%, three or four amplifier modules 5 are activated. Thus if, for example, the length of pulses 2 is determined by a duty factor of 65%, then the actual amplitude of the target signal 6 is for 60% of the time, 75% the maximum possible amplitude and for 40% of the time, 50% of the maximum possible amplitude. The resulting mean is the target amplitude of 65% of the maximum. The duty factor indicates what percentage of the maximum possible amplitude should have been realized as the target amplitude in mean terms in the target signal 6.

Figure 2:
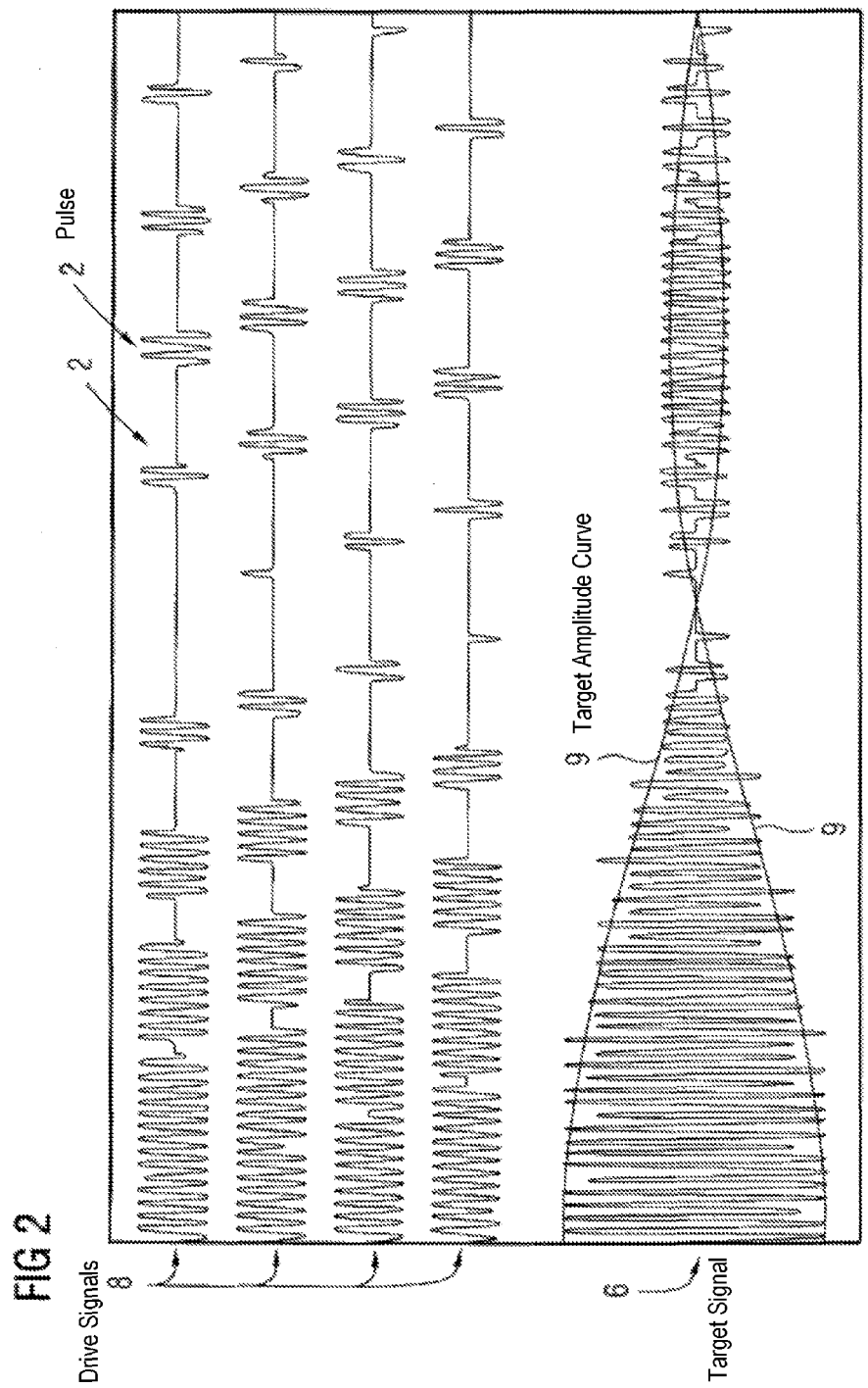
FIG. 2 shows exemplary drive signals and a resulting target signal.

This is shown more clearly in FIG. 2 using different drive signals 8, with pulses 2 having a length that varies over time, for realizing a target-amplitude curve 9 shown for the target signal 6 as the summation signal. While individual amplitudes occur that are higher than the target amplitude at this point, as a mean, the result is the desired target amplitude.

Figure 3:
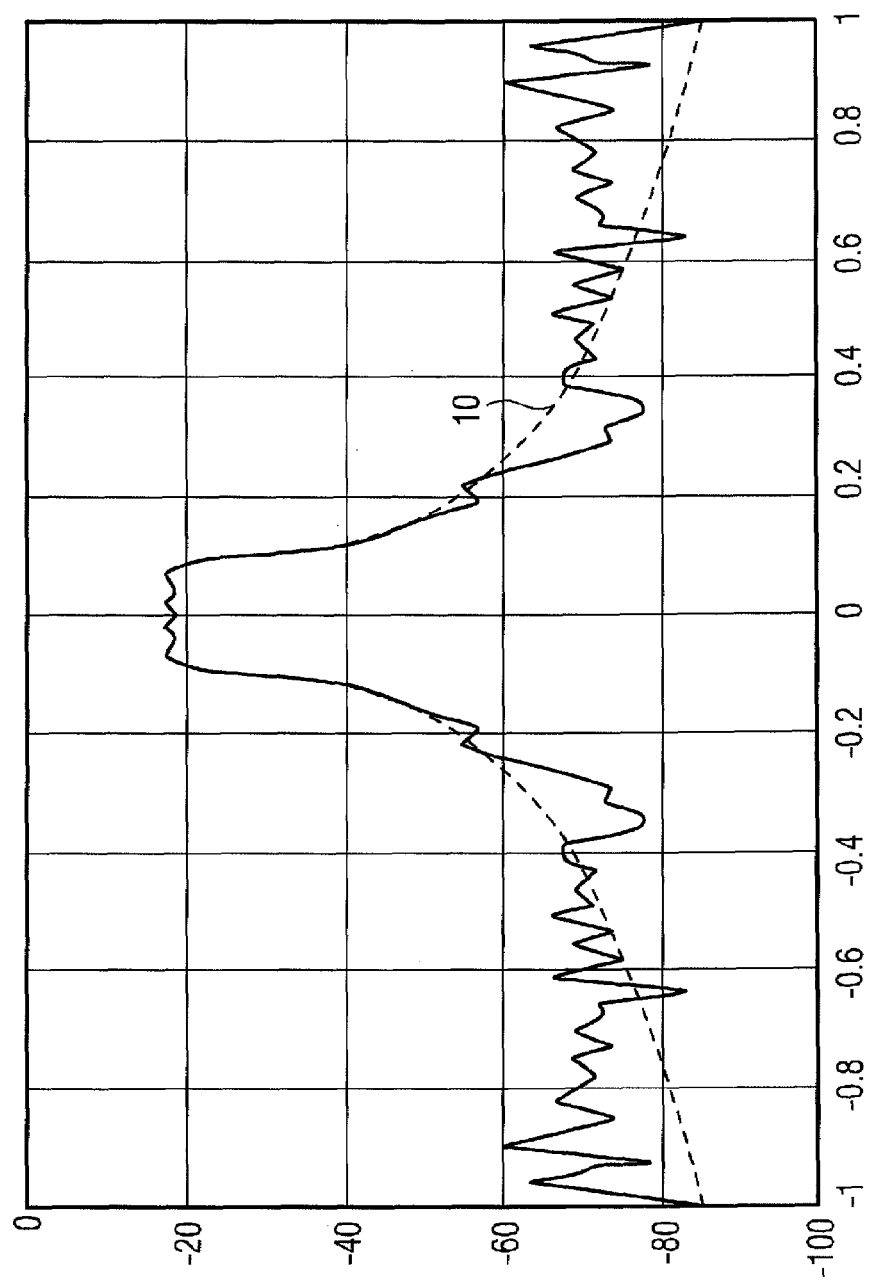
FIG. 3 shows a comparison of one embodiment of a desired spectrum and an actual spectrum of the target signal.

The target-amplitude curve 9 may therefore be imagined as being approximated in stages, which may give rise to amplitudes in sidebands. Thus, an amplitude ripple will occur. It appears predominantly at four times the pulse frequency (e.g., at 4 MHz), for example. This will not, however, cause any problems in a magnetic-resonance application, because the sidebands are outside the bandwidth that may be generated by the basic field gradients (e.g., +/−0.5 MHz). This is explained in more detail with reference to FIG. 3. FIG. 3 shows the spectrum of the summation signal (e.g., the target signal 6) in an approximately 4-MHz range, with dashed line 10 representing an ideal spectrum. FIG. 3 shows that the target signal 6 displays the desired spectrum and is interference-resistant in an environment of just under +/−4 MHz. The sidebands that arise no longer encounters excitable nuclear spins so that no interference will occur during imaging and no bandpass filtering will be necessary between an output of a transmitting device output and the high-frequency antenna.

FIG. 4 shows one embodiment of a transmitting device 11. Drive signals 8 are already generated in a control device 12 included in the overall magnetic-resonance device not shown in more detail in FIG. 4. A signal-conditioning device 13 is a part of the control device 12. Generated drive signals 8, indicated in FIG. 4 by pulses 2 that are offset in time, are fed to a power-amplifier unit 14 that is realized as an assembly and in which similar amplifier modules 5 are also provided. Integrated in the power-amplifier unit 14 is a combining device 15 that combines the output signals of the amplifier modules 5 into the target signal 6. The target signal 6 may immediately be forwarded to a high-frequency antenna 16.

Shown in FIG. 5 is a modified embodiment of a transmitting device 11'. The control device 12 does not generate drive signals 8 itself but first a conventional input signal 17 that is amplitude-modulated and in frequency and phase, already corresponds to the target frequency and the target phase. One embodiment of a power-amplifier unit 14' accordingly forms a component of the present embodiments, since the signal-conditioning device 13 embodied as a signal-conditioning circuit 18 is realized as structurally integral with the amplifier modules 5 and the combining device 15. For example, a signal-conditioning circuit 18, the amplifier modules 5, and the combining device 15 may be integrated on a single circuit board 19. The single circuit board 19 may be retained in a housing. The generated target signal 6 is fed to the high-frequency antenna 16.

Figure 6:
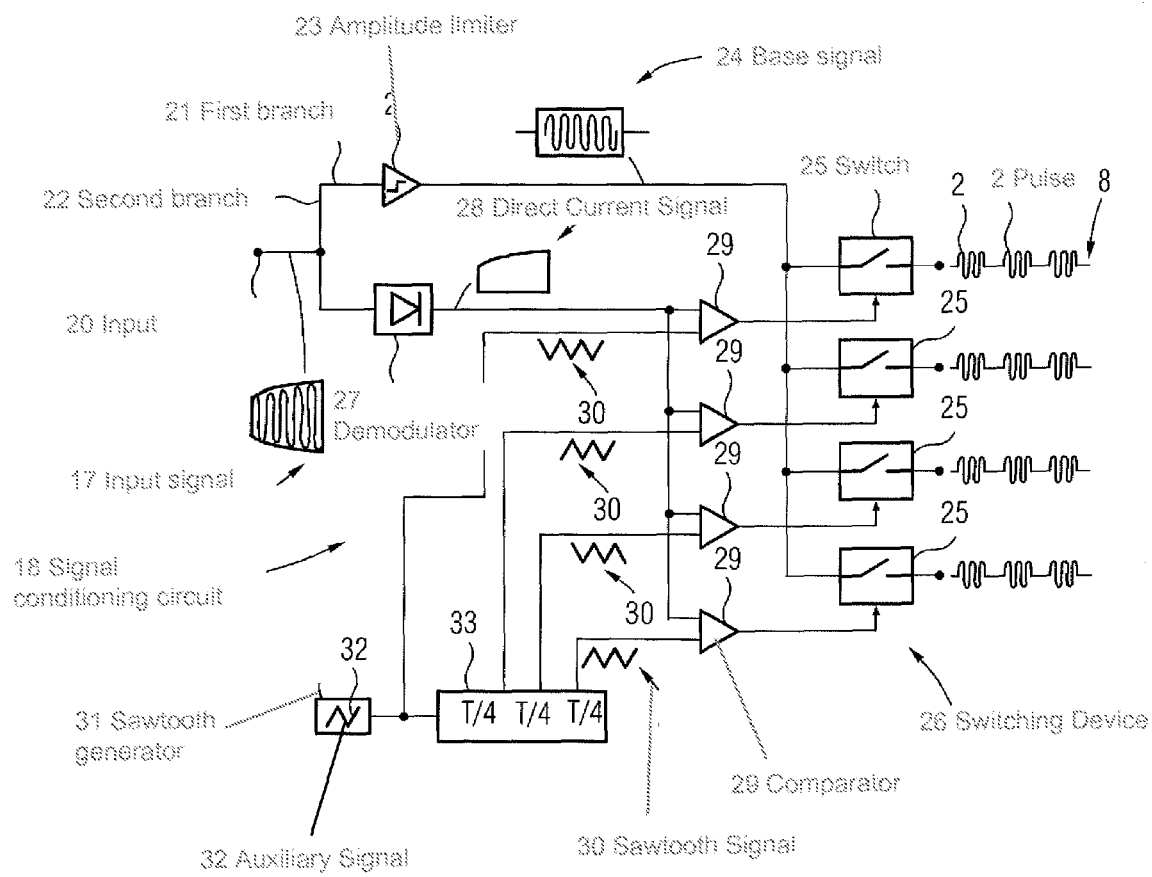
FIG. 6 shows one embodiment of a signal-conditioning circuit of the transmitting device shown in FIG. 5.

FIG. 6 shows an exemplary realization of the signal-conditioning circuit 18 in the embodiment shown in FIG. 5. As already described, the input signal 17 is applied to an input 20. The input signal 17 is amplitude-modulated in the manner, in which the target amplitude is amplitude-modulated. The input signal 17 is fed onto a first branch 21 and a second branch 22. Using an amplitude limiter 23, from the input signal 17, a base signal 24 that has a constant amplitude but the target frequency and the target phase is generated in the first branch 21. The base signal 24 is forwarded to four switches 25 of a switching device 26.

A demodulator 27 (rectifier) that, as a direct-current signal 28, extracts the amplitude curve of the input signal 17 is provided in the second branch 22. The direct-current signal 28 is fed to four comparators 29. At the four comparators 29, the direct-current signal 28 is compared with different sawtooth signals 30 derived from an auxiliary signal 32 generated by a sawtooth generator 31. While the auxiliary signal 32 may be used directly as a sawtooth signal 30 for one comparator 29, the other three sawtooth signals 30 are tapped at outputs of a time-delay block 33 that, in each case, adds a time offset of one quarter of pulse period T so that the sawtooth signals 30 are mutually offset in time by one quarter of the pulse period T. The respective sawtooth signal 30 is compared in the comparators 29 with the direct-current signal 28, with relevant switch 25 being closed whenever the direct-current signal 28 is greater than the sawtooth signal 30. The base signal 24 is sampled such that the desired target amplitude appears as the mean amplitude of the target signal 6 (e.g., the pulses 2 of the drive signals 8 are generated in such a way).

Figure 7:
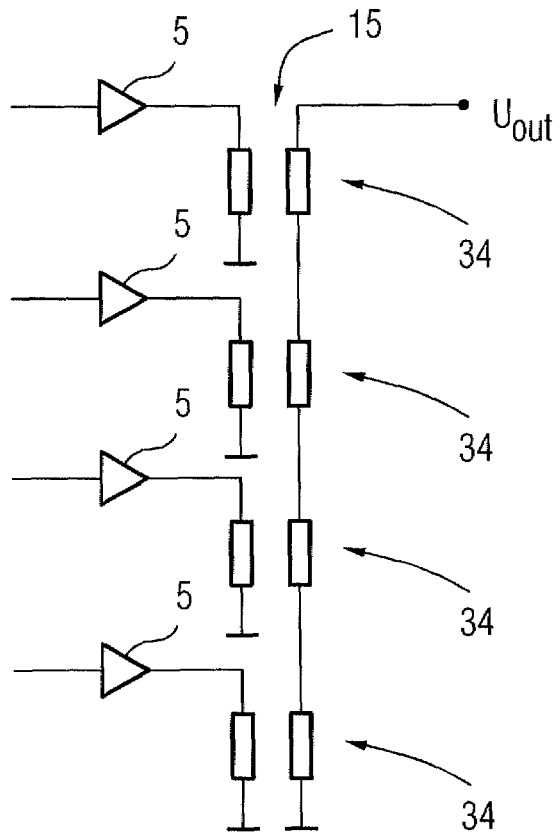
FIG. 7 shows one embodiment of a combining device.
Figure 8:
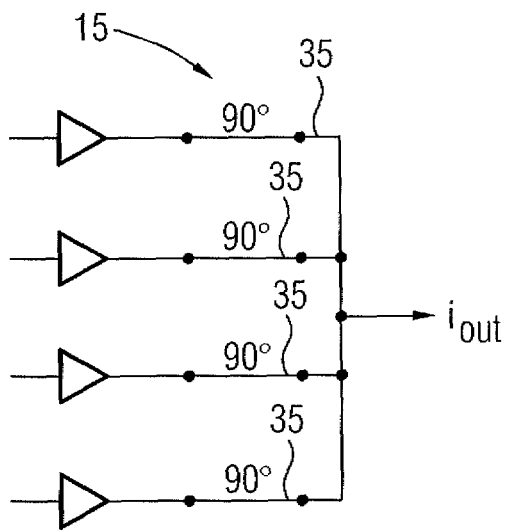
FIG. 8 shows another embodiment of a combining device.

FIGS. 7 and 8 show embodiments of the combining device 15. The embodiments of the combining device 15 may be used in both exemplary embodiments shown. FIG. 7 shows that transformers 34 are employed for combining the output signals of the amplifier modules 5. In one embodiment, according to FIG. 8, quarter-wave lines 35 are employed. 90° phase shifters may alternatively be employed. The embodiment shown in FIG. 8 may be realized more favorably in high-frequency terms.

The output signal generated by active amplifier modules 5 may traverse the currently non-active amplifier modules 5, or outputs of the non-active amplifier modules 5 may provide a low loss so that non-activated amplifier modules 5 will still be able to present a low output impedance (e.g., a short-circuit). In the embodiment having quarter-wave lines 35, the short-circuit is transformed into an open circuit at the output so that no current may flow into the unused branches from the summation node.

Figure 9:
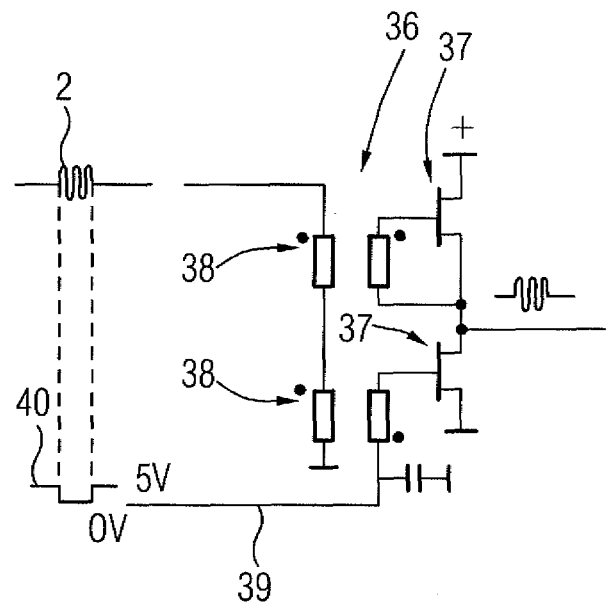
FIG. 9 shows an exemplary interconnection arrangement for an open-circuit condition at combining nodes.
Figure 10:
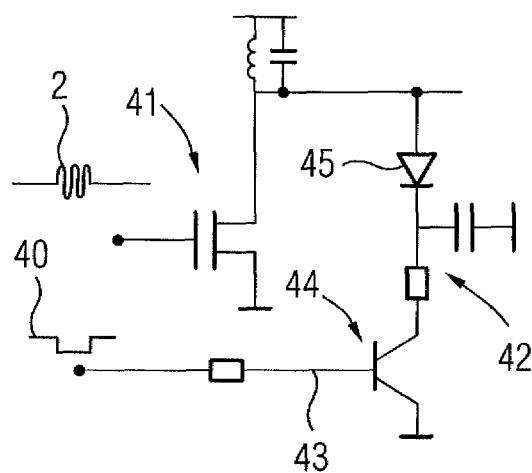
FIG. 10 shows an alternative interconnection arrangement for an open-circuit condition at the combining nodes.

FIGS. 9 and 10 show examples of how a low output impedance of such amplifier modules 5 may be realized.

As one embodiment of an amplifier module 5, FIG. 9 shows a MOSFET half-bridge 36 having two transistors 37. A transformer 38 is connected upstream of the two transistors 37 for generating 90°-offset signals for the two transistors 37. Since the two transistors 37 may not be kept trivially closed owing to the transformers 38, an additional branch 39 that that may keep a lower transistor of the two transistors 37 closed so that the low output impedance is realized when the switching voltage is applied for the lower transistor 37 is provided. A voltage is made available for that purpose (see curve 40) via the additional branch whenever no pulse 2 is being applied to amplifier module 5.

FIG. 10 shows a high-frequency amplifier stage 41 having an output that may be short-circuited via a diode switch 42. An additional line 43, via which the switch 44 (e.g., a transistor) may be closed by a signal having a curve analogous to curve 40 so that a short-circuit is created through diode 45, is provided.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A single transmitting device configured for driving a high-frequency antenna of a magnetic-resonance device, the single transmitting device generating a target signal that is amplitude-modulatable, the single transmitting device comprising:
   a plurality of amplifier modules;
   a signal-conditioning device; and
   a combining device that combines output signals of the plurality of amplifier modules into the target signal,
   wherein the signal-conditioning device is operable to generate a plurality of drive signals having a predetermined pulse frequency, the plurality of drive signals including pulses having a length that is dependent on a desired target amplitude and having a phase corresponding to a desired target phase and a frequency corresponding to the desired target frequency,
   wherein the pulses of the individual drive signals are each mutually offset in time by one divided by the number of amplifier modules of a pulse period corresponding to the pulse frequency, each drive signal of the plurality of drive signals being fed to an amplifier module of the plurality of amplifier modules, and
   wherein each pulse, of the individual drive signals is a packet of signal periods having a corresponding pulse length based on a duty factor as a function of a desired target amplitude, a same high frequency that is to be generated, the target frequency, and the target phase.

2. The single transmitting device as claimed in claim 1, wherein, for each amplifier module of the plurality of amplifier modules, the combining device includes a quarter-wave line, a 90° phase shifter, or a transformer.

3. The single transmitting device as claimed in claim 1, wherein the pulse frequency is 0.5 to 10 MHz.

4. The single transmitting device as claimed in claim 1, wherein the number of amplifier modules is 4 to 8.

5. The single transmitting device as claimed in claim 1, wherein the single transmitting device is configured for driving the plurality of amplifier modules, such that that amplifier modules of the plurality of amplifier modules, to which currently no pulse is being applied, have a low impedance.

6. The single transmitting device as claimed in claim 5, wherein the plurality of amplifier modules each have at least one transistor, and
   wherein the single transmitting device is drivable such that the at least one transistor of each amplifier module of the plurality of amplifier modules is always turned on when the single transmitting device is operating.

7. The single transmitting device as claimed in claim 6, wherein an amplifier module of the plurality of amplifier modules has a transformer connected upstream of the at least one transistor, and
   wherein an additional conductor connection, to which a switching voltage is applied when no pulse is being applied to the amplifier module, is routed to the at least one transistor.

8. The single transmitting device as claimed in claim 5, wherein an output of each amplifier module of the plurality of amplifier modules is short-circuitable via a diode switch.

9. The single transmitting device as claimed in claim 8, wherein the diode switch is a PIN diode switch.

10. The single transmitting device as claimed in claim 1, wherein when an amplitude-modulated input signal having a frequency and phase of the target signal is used, the signal-conditioning device comprises a signal-conditioning circuit.

11. The single transmitting device as claimed in claim 10, wherein the signal-conditioning circuit is structurally integral with the plurality of amplifier modules and the combining device in a power-amplifier unit,
   wherein the power-amplifier unit comprises, in a first branch, an amplitude limiter configured for generating a base signal that has a constant amplitude and the frequency and phase of the target signal,
   wherein the power-amplifier unit comprises, in a second branch, a demodulator configured for determining a direct-current signal indicating the amplitude modulation, and
   wherein the direct-current signal drives a switching device configured for generating the pulses of the plurality of drive signals from the base signal.

12. The single transmitting device as claimed in claim 11, wherein the switching device comprises:
   a plurality of comparators;
   a plurality of switches;
   one sawtooth-signal generator; and
   one time-delay block,
   wherein a sawtooth signal and outputs of the one time-delay block supplies a plurality of sawtooth signals that are each mutually offset in time by one divided by the number of amplifier modules of a pulse period corresponding to the pulse frequency and are compared by the plurality of comparators with the direct-current signal, and
   wherein, as a function of the comparison result, a switch that is assigned to both a comparator of the plurality of comparators and a first amplifier module of the plurality of amplifier modules is opened, and the base signal is forwarded to the first amplifier module.

13. The single transmitting device as claimed in claim 1, wherein the signal-conditioning device is integrated into a control device of the magnetic-resonance device.

14. The single transmitting device as claimed in claim 2, wherein the pulse frequency is 0.5 to 10 MHz.

15. The single transmitting device as claimed in claim 2, wherein the number of amplifier modules is 4 to 8.

16. The single transmitting device as claimed in claim 3, wherein the number of amplifier modules is 4 to 8.

17. The single transmitting device as claimed in claim 2, wherein the single transmitting device is configured for driving the plurality of amplifier modules, such that that amplifier modules of the plurality of amplifier modules, to which currently no pulse is being applied, have a low impedance.

18. A power-amplifier unit of a transmitting device configured for driving a high-frequency antenna of a magnetic-resonance device, the transmitting device generating a target signal that is amplitude-modulatable, the power-amplifier unit comprising:
   a signal-conditioning device;
   a plurality of amplifier modules; and
   a combining device that combines output signals of the plurality of amplifier modules into the target signal,
   wherein the signal-conditioning device, the plurality of amplifier modules, and the combining device are disposed inside a housing,
   wherein the signal-conditioning device is operable in order to generate a plurality of drive signals having a predetermined pulse frequency, the plurality of drive signals including pulses having a length that is dependent on a desired target amplitude and having a phase corresponding to a desired target phase and a frequency corresponding to a desired target frequency,
   wherein the pulses of the individual drive signals are each mutually offset in time by one divided by the number of amplifier modules of a pulse period corresponding to the pulse frequency, each drive signal of the plurality of drive signals being fed into an amplifier module of the plurality of amplifier modules, and
   wherein each pulse, of the individual drive signals is a packet of signal periods having a corresponding pulse length based on a duty factor as a function of a desired target amplitude, a same high frequency to be generated, the target frequency, and the target phase.

19. A method of generating an amplitude-modulated target signal driving a high-frequency antenna of a magnetic-resonance device, the method comprising:
   generating, with a transmitting device, a plurality of drive signals having a predetermined pulse frequency, each drive signal of the plurality of drive signals comprising pulses having a length dependent on a desired target amplitude and having a phase corresponding to a desired target phase and a frequency corresponding to a desired target frequency,
   wherein the pulses of the individual drive signals are mutually offset in time by one divided by the number of drive signals of the pulse period corresponding to the pulse frequency,
   wherein the plurality of drive signals are each amplified by amplifier modules and combined, with a combining device, into the generated amplified-modulated target signal, and
   wherein each pulse, of the individual drive signals is a packet of signal periods having a corresponding pulse length based on a duty factor as a function of a desired target amplitude, a same high frequency to be generated, the target frequency, and the target phase.

20. The method of claim 19, further comprising: providing a transmitting device configured for driving the high-frequency antenna of the magnetic-resonance device using the amplitude-modulated target signal, the transmitting device comprising:
   the amplifier modules;
   a signal conditioning device; and
   a combining device configured for combining output signals of the amplifier modules into the target signal,
   wherein the plurality of drive signals is generated by using the signal-conditioning device.

* * * * *